(12) United States Patent
Deng et al.

(10) Patent No.: US 12,414,419 B2
(45) Date of Patent: Sep. 9, 2025

(54) DISPLAY SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jiangtao Deng, Beijing (CN); Biao Liu, Beijing (CN); Jianchang Cai, Beijing (CN); Tinghua Shang, Beijing (CN); Jiaxing Chen, Beijing (CN); Yixuan Long, Beijing (CN); Zuoji Niu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/005,770

(22) PCT Filed: Jan. 29, 2022

(86) PCT No.: PCT/CN2022/075001
§ 371 (c)(1),
(2) Date: Jan. 17, 2023

(87) PCT Pub. No.: WO2023/142044
PCT Pub. Date: Aug. 3, 2023

(65) Prior Publication Data
US 2024/0274767 A1     Aug. 15, 2024

(51) Int. Cl.
*H10H 20/85* (2025.01)
*H01L 25/075* (2006.01)
(Continued)

(52) U.S. Cl.
CPC ....... *H10H 20/857* (2025.01); *H01L 25/0753* (2013.01); *H01L 25/167* (2013.01);
(Continued)

(58) Field of Classification Search
CPC ............... H10H 20/857; H10H 29/142; H01L 25/0753; H01L 25/167; H10D 86/443; H10D 86/60; G09G 3/3208
See application file for complete search history.

(56) References Cited

U.S. PATENT DOCUMENTS 9,711,585 B2    7/2017  Wang et al.
10,546,904 B2    1/2020  Hou
(Continued)

FOREIGN PATENT DOCUMENTS

CN    105938704 A    9/2016
CN    108010946 A    5/2018
(Continued)

OTHER PUBLICATIONS

Chinese First Office Action cited in CN 2022105316838, dated Apr. 30, 2025.
(Continued)

*Primary Examiner* — S M Sohel Imtiaz
(74) *Attorney, Agent, or Firm* — LEASON ELLIS LLP (57) ABSTRACT

A display substrate is provided, and the display substrate includes a first display region, a second display region and a transitional display region; the first display region includes a plurality of first sub-pixels, each first sub-pixel (P1) includes a first light-emitting device; the second display region includes a plurality of first pixel driving circuit and a plurality of first transition pixel driving circuits, the plurality of first pixel driving circuits are electrically connected to first light-emitting devices respectively through a plurality of first wires; the transition display region is between the (Continued)

first display region and the second display region, including a first transition sub-region and a second transition sub-region, a plurality of first transition light-emitting devices in the first transition sub-region are electrically connected to the plurality of first pixel driving circuits respectively through a plurality of second wires, the second transition sub-region includes a plurality of second transition sub-pixels.

20 Claims, 7 Drawing Sheets

(51) Int. Cl.
H01L 25/16 (2023.01)
H10D 86/40 (2025.01)
H10D 86/60 (2025.01)
H10H 20/857 (2025.01)
H10H 29/14 (2025.01)

(52) U.S. Cl.
CPC .......... H10D 86/443 (2025.01); H10D 86/60 (2025.01); H10H 29/142 (2025.01)

(56) References Cited

U.S. PATENT DOCUMENTS

| | | | |
|---|---|---|---|
| 10,686,018 | B2 | 6/2020 | Kim et al. |
| 11,335,748 | B2 | 5/2022 | Zhang et al. |
| 11,423,840 | B2 | 8/2022 | Shang et al. |
| 11,515,362 | B2 | 11/2022 | Yang |
| 11,587,999 | B2 | 2/2023 | Bok et al. |
| 2014/0306198 | A1 | 10/2014 | Im et al. |
| 2019/0033995 | A1 | 1/2019 | Teramoto |
| 2019/0386078 | A1 | 12/2019 | An et al. |
| 2020/0043990 | A1 | 2/2020 | Huangfu et al. |
| 2020/0212269 | A1* | 7/2020 | Akimoto ............... H10F 39/182 |
| 2021/0050388 | A1 | 2/2021 | Song |
| 2021/0183984 | A1 | 6/2021 | Park et al. |
| 2021/0184155 | A1 | 6/2021 | Chae et al. |
| 2021/0202900 | A1 | 7/2021 | Lee |
| 2021/0265396 | A1 | 8/2021 | Kim et al. |
| 2021/0391396 | A1 | 12/2021 | Yang et al. |
| 2022/0028317 | A1* | 1/2022 | Kim ..................... G09G 3/20 |
| 2022/0069031 | A1 | 3/2022 | Yue et al. |
| 2022/0157895 | A1 | 5/2022 | Xu et al. |
| 2022/0199028 | A1* | 6/2022 | Wang .................. H10K 59/131 |
| 2022/0199710 | A1 | 6/2022 | Xu et al. |
| 2022/0310710 | A1 | 9/2022 | Hu et al. |
| 2022/0319421 | A1* | 10/2022 | Qiu ....................... G09G 3/3233 |
| 2022/0366848 | A1* | 11/2022 | Huang ................. G09G 3/3266 |
| 2023/0053413 | A1* | 2/2023 | Liu ..................... H10K 59/352 |
| 2023/0413605 | A1* | 12/2023 | Lou ..................... H10K 59/123 |

FOREIGN PATENT DOCUMENTS

| | | |
|---|---|---|
| CN | 108538884 A | 9/2018 |
| CN | 109427855 A | 3/2019 |
| CN | 109686778 A | 4/2019 |
| CN | 110137206 A | 8/2019 |
| CN | 110767699 A | 2/2020 |
| CN | 111028692 A | 4/2020 |
| CN | 111048005 A | 4/2020 |
| CN | 111223908 A | 6/2020 |
| CN | 111402743 A | 7/2020 |
| CN | 211150599 U | 7/2020 |
| CN | 111834425 A | 10/2020 |
| CN | 111969027 A | 11/2020 |
| CN | 112002748 A | 11/2020 |
| CN | 112018147 A | 12/2020 |
| CN | 112133732 A | 12/2020 |
| CN | 112313802 A | 2/2021 |
| CN | 112368840 A | 2/2021 |
| CN | 112397547 A | 2/2021 |
| CN | 112562518 A | 3/2021 |
| CN | 112585761 A | 3/2021 |
| CN | 112864215 A | 5/2021 |
| CN | 112928147 A | 6/2021 |
| CN | 112951878 A | 6/2021 |
| CN | 112992969 A | 6/2021 |
| CN | 113013201 A | 6/2021 |
| CN | 113056828 A | 6/2021 |
| CN | 113178163 A | 7/2021 |
| CN | 113196494 A | 7/2021 |
| CN | 113284928 A | 8/2021 |
| CN | 113327972 A | 8/2021 |
| CN | 113674689 A | 11/2021 |
| CN | 217134376 A | 8/2022 |
| CN | 217933802 U | 11/2022 |
| WO | 2017140038 A1 | 8/2017 |
| WO | 2020133885 A1 | 7/2020 |
| WO | 2021018301 A1 | 2/2021 |

OTHER PUBLICATIONS

Chinese First Office Action cited in CN 2021111681707, dated Jul. 16, 2025.

* cited by examiner

DISPLAY SUBSTRATE

This application is a U.S. National Phase Entry of International Application No. PCT/CN2022/075001 filed on Jan. 29, 2022. The present application claims priority to and the benefit of the above-identified application and the above-identified application is incorporated by reference herein in its entirety.

TECHNICAL FIELD

Embodiments of the present disclosure relate to a display substrate.

BACKGROUND

At present, display screens for electronic devices are developing towards larger screens and full screens, so that users can have a better visual experience. Taking electronic products such as mobile phones and tablet computers as examples, because these electronic devices need to be combined with components such as cameras and light sensors, and these components usually occupy the display region of the display screen, it is difficult to achieve a full-screen design for the display screen.

SUMMARY

At least one embodiment of the present disclosure provides a display substrate, the display substrate has a base substrate, and comprises a first display region, a second display region, and a transition display region; the first display region comprises a plurality of first sub-pixels on the base substrate, each of the plurality of first sub-pixels comprises a first light-emitting device, and the first display region is at least partially light-transmissive; the second display region is on at least one side of the first display region, and comprises a plurality of first pixel driving circuits and a plurality of first transition pixel driving circuits on the base substrate; the transition display region is between the first display region and the second display region, and comprises a first transition sub-region and a second transition sub-region, the second transition sub-region is on a side of the first transition sub-region away from the first display region; the first transition sub-region comprises a plurality of first transition sub-pixels on the base substrate, each of the plurality of first transition sub-pixels comprises a first transition light-emitting device, the second transition sub-region comprises a plurality of second transition sub-pixels, and each of the plurality of second transition sub-pixels comprises a second transition light-emitting device and a second transition pixel driving circuit for driving the second transition light-emitting device to emit light; and the plurality of first pixel driving circuits are electrically connected to a plurality of first light-emitting devices of the plurality of first sub-pixels respectively through a plurality of first wires, and the plurality of first transition pixel driving circuits are electrically connected to a plurality of first transition light-emitting devices of the plurality of first transition sub-pixels respectively through a plurality of second wires.

For example, in the display substrate provided by at least one embodiment of the present disclosure, the first transition sub-region further comprises a plurality of first dummy pixel driving circuits, the plurality of first dummy pixel driving circuits are on the base substrate, and the plurality of first transition light-emitting devices of the plurality of first transition sub-pixels are respectively on a side of the plurality of first dummy pixel driving circuits away from the base substrate; and in a direction perpendicular to the base substrate, the plurality of first transition light-emitting devices of the plurality of first transition sub-pixels respectively at least partially overlap with the plurality of first dummy pixel driving circuits.

For example, in the display substrate provided by at least one embodiment of the present disclosure, in a direction perpendicular to the base substrate, the second transition light-emitting device at least partially overlaps with the second transition pixel driving circuit.

For example, in the display substrate provided by at least one embodiment of the present disclosure, the second display region further comprises a plurality of second sub-pixels, each of the plurality of second sub-pixels comprises a second light-emitting device and a second pixel driving circuit for driving the second light-emitting device to emit light; and the second pixel driving circuit is on the base substrate, the second light-emitting device is on a side of the second pixel driving circuit away from the base substrate, and in a direction perpendicular to the base substrate, the second light-emitting device at least partially overlaps with the second pixel driving circuit.

For example, in the display substrate provided by at least one embodiment of the present disclosure, the plurality of first pixel driving circuits are arranged in a plurality of columns, a plurality of second pixel driving circuits of the plurality of second sub-pixels are arranged in a plurality of columns, and 3-4 columns of second pixel driving circuits are arranged between every two adjacent columns of first pixel driving circuits.

For example, in the display substrate provided by at least one embodiment of the present disclosure, in the direction perpendicular to the base substrate, each of at least part of the plurality of second sub-pixels overlaps with 12-14 wires, the 12-14 wires are 12-14 first wires, or a part of the 12-14 wires is the first wire, and another part of the 12-14 wires is the second wire.

For example, in the display substrate provided by at least one embodiment of the present disclosure, the first wire is at least partially light-transmissive, and the second wire is at least partially light-transmissive or opaque.

For example, in the display substrate provided by at least one embodiment of the present disclosure, in the first display region, the plurality of first sub-pixels are arranged in a plurality of rows and columns; in the second display region, the plurality of first pixel driving circuits are arranged in a plurality of rows and columns; and a light-emitting device of a first sub-pixel and a first pixel driving circuit, electrically connected to each other through a first wire, are in a same row.

For example, in the display substrate provided by at least one embodiment of the present disclosure, the plurality of first sub-pixels comprise a first sub-pixel in an (N)th column and a first sub-pixel in an (N+1)th column, both of which are in a same row, and the first sub-pixel in the (N+1)th column is on a side of the first sub-pixel in the (N)th column away from the second display region; the plurality of first pixel driving circuits comprise a first pixel driving circuit in an (M)th column and a first pixel driving circuit in an (M+1)th column, both of which are in a same row, and the first pixel driving circuit in the (M+1)th column is on a side of the first pixel driving circuit in the (M)th column away from the first display region; and a first light-emitting device of the first sub-pixel in the (N)th column is electrically connected to the first pixel driving circuit in the (M)th column, and a first light-emitting device of the first sub-pixel in the (N+1)th column is electrically connected to the first pixel driving circuit in the (M+1)th column.

For example, in the display substrate provided by at least one embodiment of the present disclosure, the first light-emitting device comprises a first electrode electrically connected to the first pixel driving circuit, the second light-emitting device comprises a second electrode electrically connected to the second pixel driving circuit, and an average size of a plurality of first electrodes of a plurality of first light-emitting devices of the plurality of first sub-pixels is smaller than an average size of a plurality of second electrodes of a plurality of second light-emitting devices of the plurality of second sub-pixels.

For example, in the display substrate provided by at least one embodiment of the present disclosure, the first transition light-emitting device comprises a first transition electrode electrically connected to the first transition pixel driving circuit, and an average size of a plurality of first transition electrodes of a plurality of first transition light-emitting devices of the plurality of first transition sub-pixels is smaller than the average size of the plurality of second electrodes of the plurality of second light-emitting devices of the plurality of second sub-pixels.

For example, in the display substrate provided by at least one embodiment of the present disclosure, the second transition light-emitting device comprises a second transition electrode electrically connected to the second transition pixel driving circuit, and an average size of a plurality of second transition electrodes of a plurality of second transition light-emitting devices of the plurality of second transition sub-pixels is smaller than the average size of the plurality of second electrodes of the plurality of second light-emitting devices of the plurality of second sub-pixels.

For example, in the display substrate provided by at least one embodiment of the present disclosure, the average size of the plurality of second transition electrodes of the plurality of second transition light-emitting devices of the plurality of second transition sub-pixels is equal to the average size of the plurality of first transition electrodes of the plurality of first transition light-emitting devices of the plurality of first transition sub-pixels.

For example, in the display substrate provided by at least one embodiment of the present disclosure, the average size of the plurality of first transition electrodes of the plurality of first transition light-emitting devices of the plurality of first transition sub-pixels is greater than or equal to the average size of the plurality of first electrodes of the plurality of first light-emitting devices of the plurality of first sub-pixels.

For example, in the display substrate provided by at least one embodiment of the present disclosure, the first transition sub-region comprises two columns of first transition sub-pixels adjacent to the first display region.

For example, in the display substrate provided by at least one embodiment of the present disclosure, the second transition sub-region comprises at least two columns of second transition sub-pixels adjacent to the first transition sub-region.

For example, in the display substrate provided by at least one embodiment of the present disclosure, the at least two columns of second transition sub-pixels comprise 2-8 columns of second transition sub-pixels.

For example, in the display substrate provided by at least one embodiment of the present disclosure, the transition display region as a whole is rectangular or arc-shaped.

For example, the display substrate provided by at least one embodiment of the present disclosure further comprises a third display region, the third display region at least partially surrounds the first display region and the second display region, the third display region comprises a plurality of third sub-pixels, and each of the plurality of third sub-pixels comprises a third light-emitting device and a third pixel driving circuit for driving the third light-emitting device; and in a direction perpendicular to the base substrate, the third light-emitting device overlaps with the third pixel driving circuit.

For example, in the display substrate provided by at least one embodiment of the present disclosure, the third display region further comprises a plurality of second dummy pixel driving circuits, and the plurality of second dummy pixel driving circuits are arranged in a plurality of columns; a plurality of third pixel driving circuits of the plurality of third sub-pixels are arranged in a plurality of columns; and 3-4 columns of third pixel driving circuits are arranged between two adjacent columns of second dummy pixel driving circuits

BRIEF DESCRIPTION OF THE DRAWINGS

In order to clearly illustrate the technical solutions of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In order to realize the full-screen design of the display screen, in some embodiments, part of the display region for installing components such as sensors (for example, image sensors and infrared sensors) may be designed as a light-transmissive display region, so that the light-transmissive display region can facilitate the installation of components such as sensors while realizing the display function.

Figure 1A:
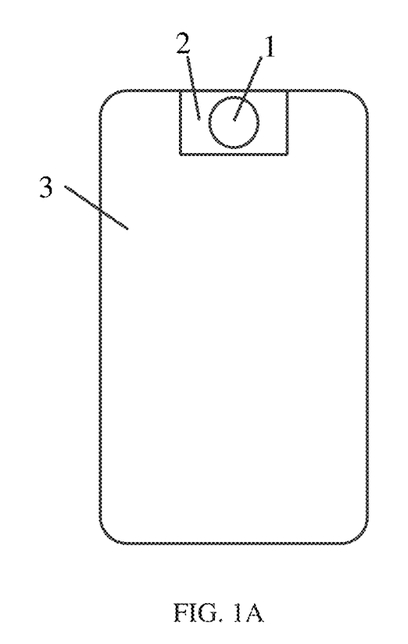
FIG. 1A is a schematic plan view of a display substrate.
Figure 1B:
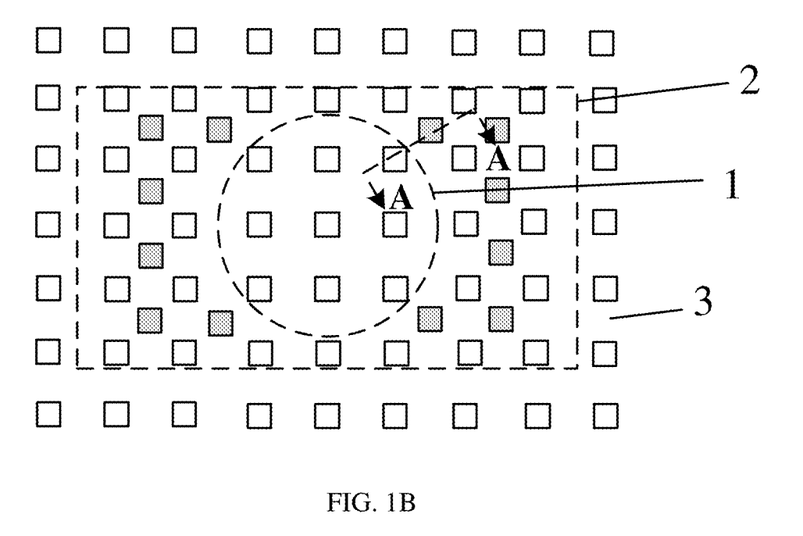
FIG. 1B is a schematic partially enlarged view of the display substrate in FIG. 1A.
Figure 2:
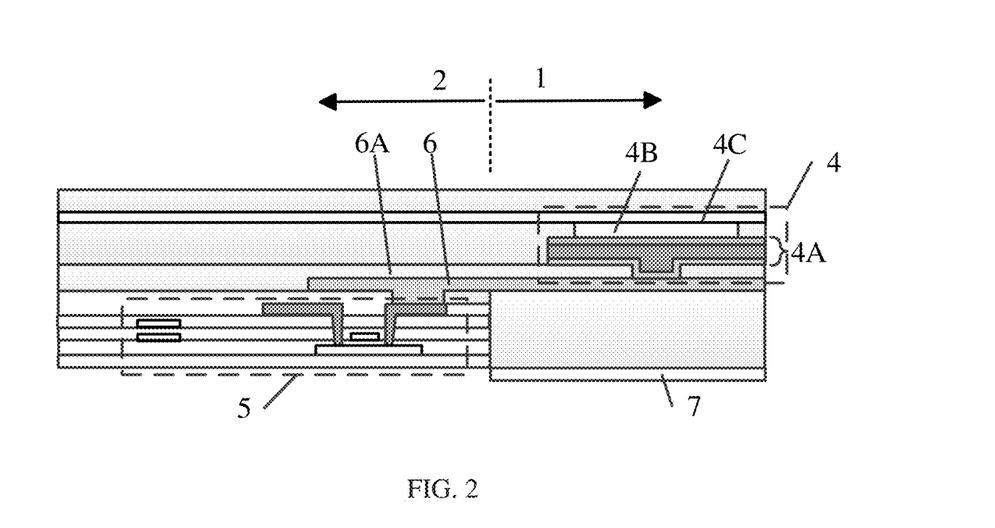
FIG. 2 is a schematic cross-sectional view of the display substrate in FIG. 1B along a line A-A.

For example, FIG. 1A illustrates a schematic plan view of a display substrate, FIG. 1B is a schematic partially enlarged view of the display substrate illustrated in FIG. 1A, and FIG. 2 illustrates a schematic cross-sectional view of the display substrate in FIG. 1B along a line A-A. As illustrated in FIG. 1A, FIG. 1B and FIG. 2, the display region of the display substrate includes a light-transmissive display region 1, a peripheral display region 2 and a main body display region 3.

For example, the main body display region 3 is a main display region, the main body display region 3 includes a plurality of sub-pixels arranged in an array, and each sub-pixel includes a light-emitting device and a pixel driving circuit for driving the light-emitting device. The light-transmissive display region 1 can allow light incident from a display side of the display substrate to pass through the display substrate and reach a backside of the display substrate, so as to be used for normal operation of components such as sensors on the backside of the display substrate. The light-transmissive display region 1 and the peripheral display region 2 also include a plurality of sub-pixels for display. However, because the pixel driving circuit of the sub-pixel is generally opaque, in order to ensure the light transmittance of the light-transmissive display region 1, the pixel driving circuit of the sub-pixel (for example, as illustrated by a frame in the light-transmissive display region 1 in FIG. 1B) in the light-transmissive display region 1 can be provided in the peripheral display region 2, as illustrated by a gray frame in the peripheral display region 2.

As illustrated in FIG. 2, a light-emitting device 4 of a sub-pixel in the light-transmissive display region 1 includes an anode 4A, a cathode 4C, and a light-emitting layer 4B between the anode 4A and the cathode 4C. The anode 4A is electrically connected to a pixel driving circuit 5 in the peripheral display region 2 through a transparent wire 6 (such as an ITO wire), so that the pixel driving circuit 5 in the peripheral display region 2 can be used to drive the light-emitting device 4 in the light-transmissive display region 1. Because the transparent wire 6 has a high light transmittance, it can ensure that the light-transmissive display region 1 also has a high light transmittance. Thus, components such as a sensor 7 on the backside of the display substrate can receive the light transmitted from the display side of the display substrate through the light-transmissive display region 1 to perform normal operation.

However, the inventor(s) of the present disclosure found in the research that due to the different structures of the light-transmissive display region 1 and the peripheral display region 2, the display effects of the light-transmissive display region 1 and the peripheral display region 2 will be different, so that the display effect of the display panel at the boundary between the light-transmissive display region 1 and the peripheral display region 2 is uneven; on the other hand, the number of transparent wires 6 is too large to be arranged in the peripheral display region 2, thus increasing the difficulty of the wiring layout of the display substrate, and the excessive transparent wires 6 may further form parasitic capacitance with other circuit structures on the display substrate, affecting signal transmission.

At least one embodiment of the present disclosure provides a display substrate, the display substrate has a base substrate, and includes a first display region, a second display region, and a transitional display region; the first display region includes a plurality of first sub-pixels on the base substrate, each of the plurality of first sub-pixels includes a first light-emitting device, and the first display region is at least partially light-transmissive; the second display region is on at least one side of the first display region, including a plurality of first pixel driving circuits and a plurality of first transition pixel driving circuits on the base substrate; the transition display region is between the first display region and the second display region, including a first transition sub-region and a second transition sub-region, and the second transition sub-region is on a side of the first transition sub-region away from the first display region; the first transition sub-region includes a plurality of first transition sub-pixels on the base substrate, each of the plurality of first transition sub-regions includes a first transition light-emitting device, the second transition sub-region includes a plurality of second transition sub-pixels, and each of the plurality of second transition sub-pixels includes a second transition light-emitting device and a second transition pixel driving circuit for driving the second transition light-emitting device to emit light; and the plurality of first pixel driving circuits are electrically connected to a plurality of first light-emitting devices of the plurality of first sub-pixels respectively through a plurality of first wires, and the plurality of first transition pixel driving circuits are electrically connected to a plurality of first transition light-emitting devices of the plurality of first transition sub-pixels respectively through a plurality of second wires.

In the above-mentioned display substrate provided by the embodiments of the present disclosure, the transition display region can alleviate or even eliminate the difference in display effect of the display substrate at the boundary between the first display region and the second display region, making the display effect of the display substrate more uniform; on the other hand, the second transition sub-pixel in the second transition sub-region adopts a mode of in-situ driving, so the number of wires can be reduced, thereby simplifying the layout of the wires, and reducing or even eliminating the phenomenon of parasitic capacitance generated by some circuits due to improper arrangement of the wires; and on the other hand, the display substrate can realize a large-screen and full-screen design, thereby improving user experience.

In the following, the display substrate provided by the embodiments of the present disclosure will be described in detail through several specific embodiments.

Figure 3:
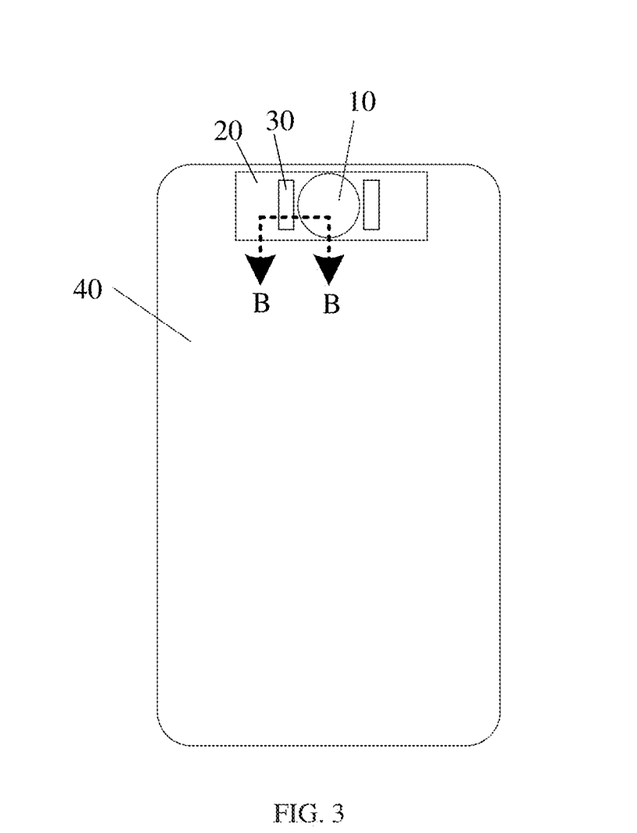
FIG. 3 is a schematic plan view of a display substrate provided by at least one embodiment of the present disclosure.
Figure 4:
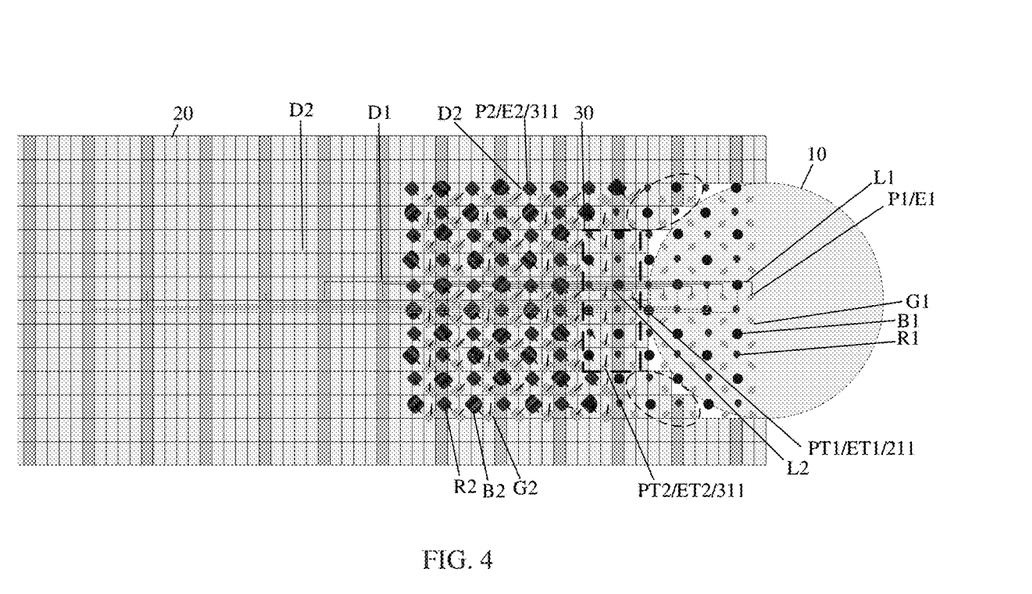
FIG. 4 is a schematic partially enlarged view of a first display region and a second display region of the display substrate in FIG. 3.
Figure 5:
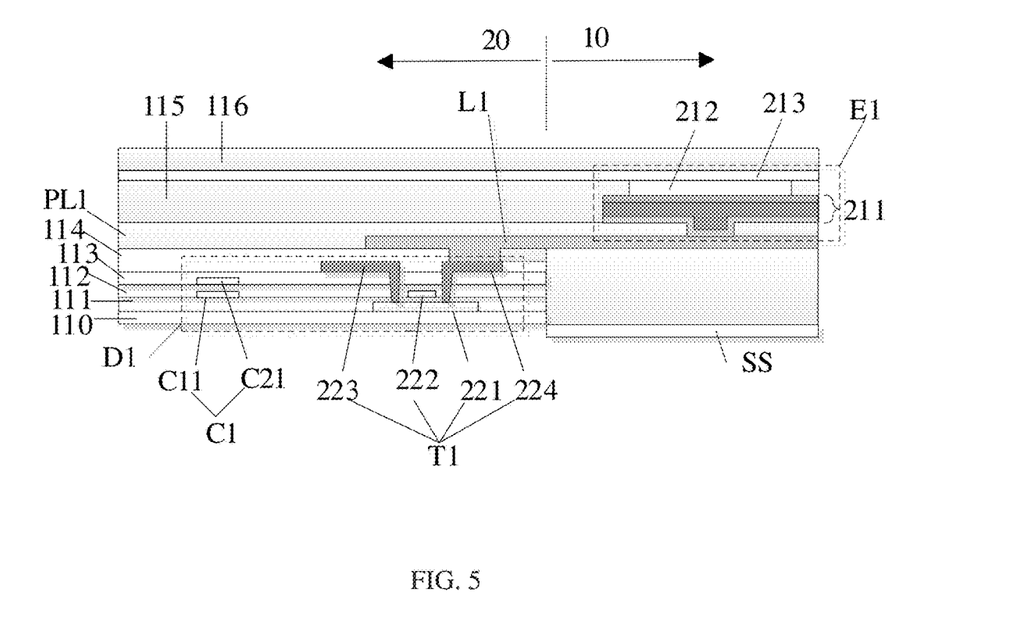
FIG. 5 is a schematic cross-sectional view of the display substrate in FIG. 3 along a line B-B.

At least one embodiment of the present disclosure provides a display substrate, FIG. 3 illustrates a schematic plan view of the display substrate, FIG. 4 illustrates a schematic partially enlarged view of the display substrate in FIG. 3, and FIG. 5 illustrates a schematic cross-sectional view of the display substrate in FIG. 3 along a line B-B. As illustrated in FIG. 3 to FIG. 5, the display substrate has a base substrate 110 and includes a first display region 10, a second display region 20, and a transitional display region 30.

The first display region 10 includes a plurality of first sub-pixels P1 on the base substrate 110, and each of the plurality of first sub-pixels P1 includes a first light-emitting device E1. The first display region 10 is at least partially light-transmissive, that is, the first display region 10 allows light from a display side of the display substrate to at least partially pass through the display substrate to reach a non-display side of the display substrate, so as to allow photosensitive devices, such as cameras, infrared sensors and other devices, on the non-display side of the display substrate to work. Therefore, the first display region 10 can not only display, but also assist devices such as cameras and infrared sensors to work normally, thereby realizing a large-screen and full-screen design of the display substrate.

Figure 6:
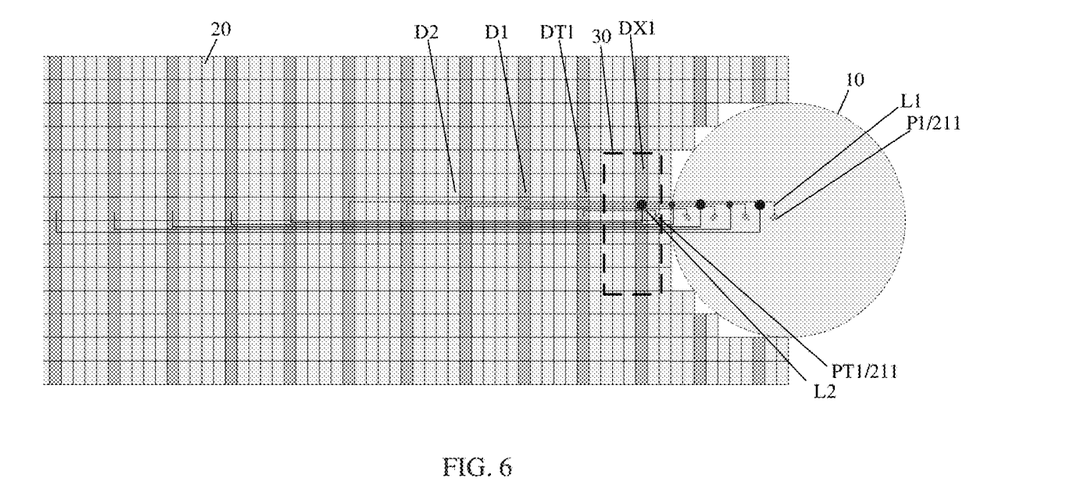
FIG. 6 is a schematic diagram of a partial structure of the display substrate in FIG. 4.

The second display region 20 is on at least one side of the first display region 10, illustrated as the left side in FIG. 4, and includes a plurality of first pixel driving circuits D1 and a plurality of first transition pixel driving circuits DT1 on the base substrate 110. For clarity, FIG. 6 illustrates a schematic diagram of a partial structure of the display substrate in FIG. 4.

Figure 7:
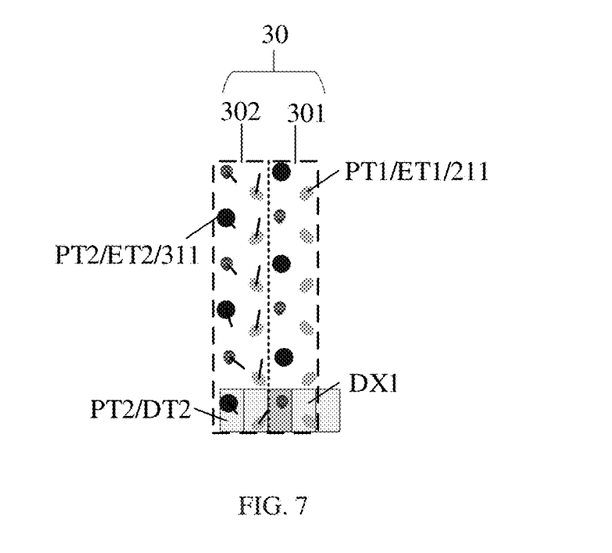
FIG. 7 is a schematic plan view of a transition display region of a display substrate provided by at least one embodiment of the present disclosure.

The transitional display region 30 is between the first display region 10 and the second display region 20, and FIG. 7 illustrates a schematic partially plan view of the transition display region. As illustrated in FIG. 7, the transition display region 30 includes a first transition sub-region 301 and a second transition sub-region 302, and the second transition sub-region 302 is on a side of the first transition sub-region 301 away from the first display region 10.

The first transition sub-region 301 includes a plurality of first transition sub-pixels PT1 on the base substrate 110, and each of the plurality of first transition sub-pixels PT1 includes a first transition light-emitting device ET1. The second transition sub-region 302 includes a plurality of second transition sub-pixels PT2, and each of the plurality of second transition sub-pixels PT2 includes a second transition light-emitting device ET2 and a second transition pixel driving circuit DT2 for driving the second transition light-emitting device ET2 to emit light. Only part of the second transition pixel driving circuit DT2 is illustrated in FIG. 7 as an example.

For example, the plurality of first pixel driving circuits D1 are electrically connected to the plurality of first light-emitting devices E1 of the plurality of first sub-pixels P1 respectively through a plurality of first wires L1, and the plurality of first transition pixel driving circuits DT1 are electrically connected to a plurality of first transition light-emitting devices ET1 of the plurality of first transition sub-pixels PT1 respectively through a plurality of second wires L2. Therefore, the plurality of first pixel driving circuits D1 in the second display region 20 can respectively drive the plurality of first light-emitting devices E1 of the plurality of first sub-pixels P1, and the plurality of first transition pixel driving circuits DT1 in the second display region 20 can respectively drive the plurality of first transition light-emitting devices ET1 of the plurality of first transition sub-pixels PT1.

For example, FIG. 5 illustrates a schematic cross-sectional view of the display substrate in FIG. 3 along a line B-B, and FIG. 5 illustrates the connection manner between the first light-emitting device and the first pixel driving circuit. In some embodiments, as illustrated in FIG. 5, the first pixel driving circuit D1 includes structures such as a thin film transistor T1 and a storage capacitor C1, the first pixel driving circuit D1 may be formed as a 3T1C pixel driving circuit, a 7T1C pixel driving circuit, etc., and the embodiments of the present disclosure do not limit the specific form of the pixel driving circuit.

For example, the thin film transistor T1 includes an active layer 221, a gate electrode 222, and source-drain electrodes 223 and 224. The storage capacitor C1 includes a first capacitor plate C11 and a second capacitor plate C12. The active layer 221 is on the base substrate 110, the gate electrode 222 and the first capacitor plate C11 are in the same layer and on a side of the active layer 221 away from the base substrate 110, the second capacitor plate C12 is on a side of the gate electrode 222 and the first capacitor plate C11 away from the base substrate 110, and the source-drain electrodes 223 and 224 are on a side of the second capacitor plate C12 away from the base substrate 110.

It should be noted that, in the embodiments of the present disclosure, "in the same layer" means that two (or more) functional layers or structural layers are formed in the same layer and with the same material in the hierarchical structure of the display substrate, that is, in the manufacturing process, the two functional layers or structural layers can be formed from the same material layer, and the required pattern and structure can be formed through the same patterning process.

For example, as illustrated in FIG. 5, the first light-emitting device E1 includes a first electrode 211, a second electrode 213, and a light-emitting material layer 212 between the first electrode 211 and the second electrode 213. The first electrode 211 is served as, for example, an anode of the first light-emitting device E1, and the second electrode 213 is served as, for example, a cathode of the first light-emitting device E1. The first electrode 211 is connected to the source-drain electrode 224 of the thin film transistor T1 of the first pixel driving circuit D1 through a first wire L1.

For example, the first electrode 211 may adopt a single-layer or multi-layer structure, such as a multi-layer structure of Ag/ITO/Ag, etc.

For example, in a direction perpendicular to the base substrate 110, that is, in the vertical direction in the figure, a plurality of first wires L1 are arranged between the first electrode 211 and the source-drain electrodes 223 and 224.

For example, as illustrated in FIG. 5, the display substrate further includes a first gate insulating layer 111 on a side of the active layer 221 away from the base substrate 110, a second gate insulating layer 111 on a side of the gate electrode 222 away from the base substrate 110, an interlayer insulating layer 113 on a side of the second capacitor plate C12 away from the base substrate 110, a planarization layer 114 on a side of the source-drain electrodes 223 and 224 away from the base substrate 110, and a planarization layer PLN1 on a side of the first wire L1 away from the base substrate 110. For example, the materials of the planarization layer PL1 and the planarization layer 114 are the same, for example, are organic insulating materials, such as polyimide, epoxy resin and other organic insulating materials.

For example, in some embodiments, as illustrated in FIG. 5, the display substrate further includes a sensor SS, the sensor SS is on the non-display side of the display substrate, and the orthographic projection of the sensor SS on the base substrate 110 at least partially overlaps with the first display region 10, and is configured to receive light from the display side of the display substrate for normal operation of the sensor SS. For example, the sensor SS may be a device such as a camera or an infrared sensor, and can realize multiple functions such as taking pictures, face recognition, and infrared sensing through the first display region 10.

Figure 8:
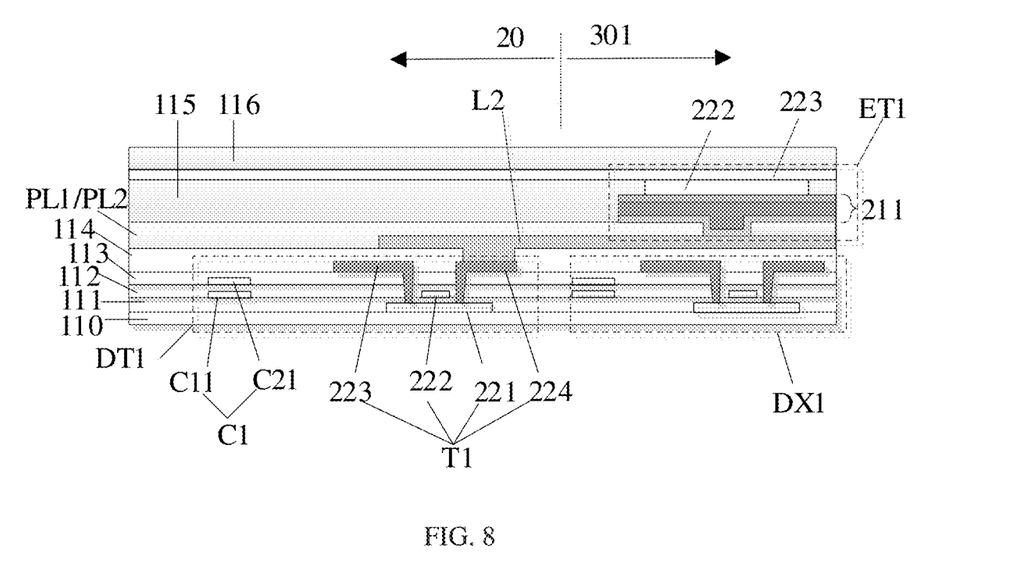
FIG. 8 is a schematic partially cross-sectional view of a first transition sub-pixel in a first transition display region of a display substrate provided by at least one embodiment of the present disclosure.

For example, in some embodiments, as illustrated in FIG. 6 and FIG. 7, the first transition sub-region 301 further includes a plurality of first dummy pixel driving circuits DX1. For example, FIG. 8 illustrates a schematic partially cross-sectional view of the first transition sub-pixel and the first dummy pixel driving circuit. As illustrated in FIG. 8, the plurality of first dummy pixel driving circuits DX1 are on the base substrate 110, and a plurality of first transition light-emitting devices ET1 of the plurality of first transition sub-pixels PT1 are respectively on a side of the plurality of first dummy pixel driving circuits DX1 away from the base substrate 110. In the direction perpendicular to the base substrate 110, the plurality of first transition light-emitting devices ET1 of the plurality of first transition sub-pixels PT1 at least partially overlap with the plurality of first dummy pixel driving circuits DX1, respectively.

For example, the structure of the first dummy pixel driving circuit DX1 is basically the same as the structure of the first pixel driving circuit D1 and the structure of the first transitional pixel driving circuit DT1, but the first dummy pixel driving circuit DX1 is not used to drive a light-emitting device. Providing the first dummy pixel driving circuit DX1 can improve the etching uniformity of the pixel driving circuit, which is near the first display region 10 for driving the light-emitting device, in the manufacturing process of the display substrate, and can prevent the threshold voltage Vth of the thin film transistor in the pixel driving circuit, which is around the first display region 10 for driving the light-emitting device, from drifting, thereby ensuring the stability of the performance of the pixel driving circuit for driving the light-emitting device around the first display region 10, and improving the display effect of the display substrate.

For example, in some embodiments, in the direction perpendicular to the base substrate 110, in the second transition sub-pixel PT2, the second transition light-emitting device ET2 at least partially overlaps with the second transition pixel driving circuit DT2. That is, the second transition sub-pixel PT2 adopts a mode of in-situ driving, and its light-emitting device and its pixel driving circuit occupy substantially the same space on the base substrate, and there is no need to use an additional wire to connect the light-emitting device to a pixel driving circuit which is far away from the light-emitting device.

For example, in some embodiments, as illustrated in FIG. 4, the second display region 20 further includes a plurality of second sub-pixels P2, and each of the plurality of second sub-pixels P2 includes a second light-emitting device E2 and a second pixel driving circuit D2 for driving the second light-emitting device E2. The second pixel driving circuit D2 is on the base substrate 110, the second light-emitting device E2 is on a side of the second pixel driving circuit D2 away from the base substrate 110, and in the direction perpendicular to the base substrate 110, the second light-emitting device E2 at least partially overlaps with the second pixel driving circuit D2. Therefore, each second sub-pixel P2 adopts a mode of "in-situ driving".

Figure 9:
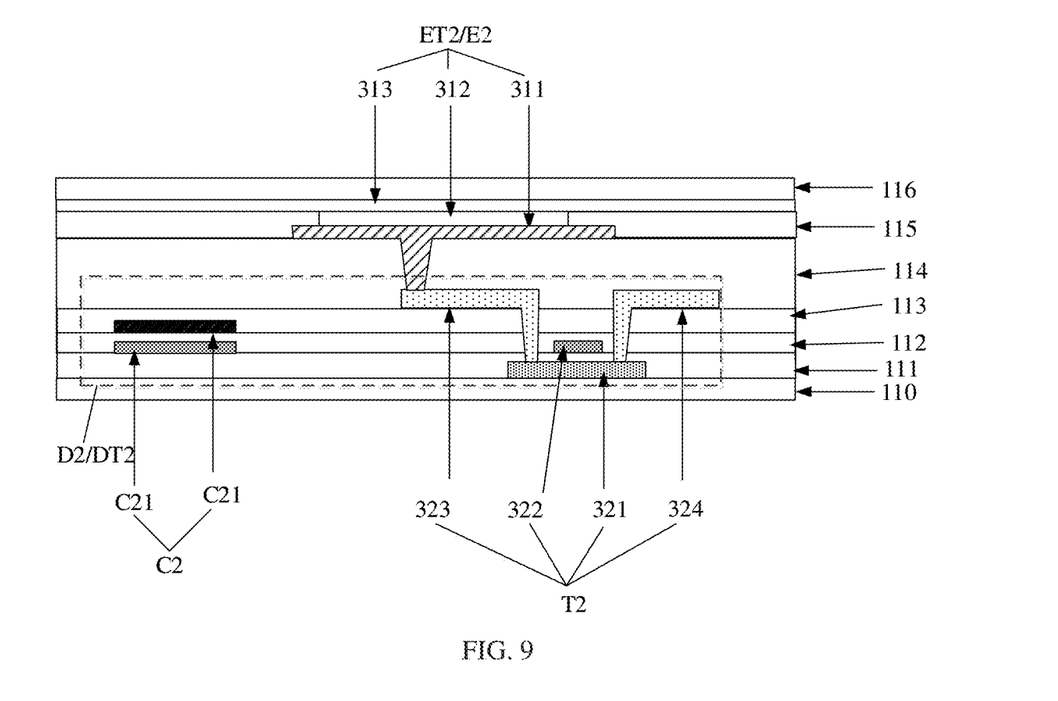
FIG. 9 is a schematic partially cross-sectional view of a second transition sub-pixel in a second transition display region or a second sub-pixel in a second display region of a display substrate provided by at least one embodiment of the present disclosure.

For example, FIG. 9 illustrates a schematic partially cross-sectional view of the second sub-pixel or the second transitional sub-pixel. Because the structures of the second sub-pixel P2 and the second transition sub-pixel PT2 are basically the same, one diagram is used to schematically show them. As illustrated in FIG. 9, the second pixel driving circuit D2 of the second sub-pixel P2 includes a thin film transistor T2 and a storage capacitor C2.

For example, as illustrated in FIG. 9, the thin film transistor T2 has basically the same structure as the thin film transistor T1, including an active layer 321, a gate electrode 322, source-drain electrodes 323 and 324, and other structures. The storage capacitor C2 has basically the same structure as the storage capacitor C1, including a first capacitor plate C21 and a second capacitor plate C22. The second light-emitting device E2 of the second sub-pixel P2 includes a first electrode 311 electrically connected to the second pixel driving circuit D2, a second electrode 313, and a light-emitting material layer 312 between the first electrode 311 and the second electrode 313. For example, the first electrode 311 is served as an anode, and the second electrode 313 is served as a cathode.

Similarly, the second transition pixel driving circuit DT2 of the second transition sub-pixel PT2 includes a thin film transistor T2 and a storage capacitor C2, and the second transition light-emitting device ET2 of the second transition sub-pixel PT2 includes a first electrode 311 electrically connected to the second transition pixel driving circuit DT2, a second electrode 313, and a light-emitting material layer 312 between the first electrode 311 and the second electrode 313.

Thus, in the transition display region 30, the first transition sub-region 301 close to the first display region 10 has the first transition sub-pixel PT1 whose driving mode is basically the same as that of the first sub-pixel P1 in the first display region 10, in addition, the first dummy pixel driving circuit DX1 is under the first transition light-emitting device ET1 of the first transition sub-pixel PT1; and the second transition sub-region 302 close to the second display region 20 has the second transition sub-pixel PT2 whose driving mode is basically the same as that of the second sub-pixel P2 in the second display region 20. Thus, the transition display region 30 forms a transition between the second display region 20 and the first display region 10. The transition display region 30 can alleviate or even eliminate the difference in display effect of the display substrate at the boundary between the first display region 10 and the second display region 20, making the display effect of the display substrate more uniform; on the other hand, the second transition sub-pixel PT2 in the second transition sub-region 302 adopts the mode of in-situ driving, so the number of wires can be reduced, thereby simplifying the layout of the wires, and reducing or even eliminating the phenomenon of parasitic capacitance generated by some circuits due to improper arrangement of the wires.

For example, in some embodiments, as illustrated in FIG. 4 and FIG. 6, the plurality of first pixel driving circuits D1 are arranged in a plurality of columns, the plurality of second pixel driving circuits D2 of the plurality of second sub-pixels P2 are arranged in a plurality of columns, and 3-4 columns of second pixel driving circuits D2 are provided between every two adjacent columns of first pixel driving circuits D1.

For example, in some embodiments, as illustrated in FIG. 4, the plurality of first sub-pixels P1 in the first display region 10 include a first red sub-pixel R1, a first green sub-pixel G1 and a first blue sub-pixel B1, one first red sub-pixel R1, two first green sub-pixels G1 and one first blue sub-pixel B1 form a first pixel unit, and in the first display region 10, a plurality of first pixel units are arranged periodically. Similarly, in the second display region 20, the plurality of second sub-pixels P2 includes a second red sub-pixel R2, a second green sub-pixel G2 and a second blue sub-pixel B2, one second red sub-pixel R2, two second green sub-pixel G2 and one second blue sub-pixel B2 form a second pixel unit, and in the second display region 20, a plurality of second pixel units are arranged periodically.

In this case, in the second display region 20, 4 columns of second pixel driving circuits D2 are provided between every two adjacent columns of first pixel driving circuits D1, and the 4 columns of second pixel driving circuits D2 are respectively used to drive a plurality of second pixel units.

For example, in other embodiments, one second pixel unit may include one second red sub-pixel R2, one second green sub-pixel G2, and one second blue sub-pixel B2, in this case, 3 columns of second pixel driving circuits D2 are provided between every two adjacent columns of first pixel driving circuit D1, and the 3 columns of second pixel driving circuits D2 are respectively used to drive a plurality of second pixel units.

For example, in the above-mentioned embodiment, because the second transition sub-pixel PT2 in the second transition sub-region 302 adopts the mode of in-situ driving, no additional wires is required, and therefore the first wire L1 and the second wire L2 for connecting the light-emitting devices of the first sub pixel P1 and the first transition sub-pixel PT1 can have sufficient layout space.

Figure 10:
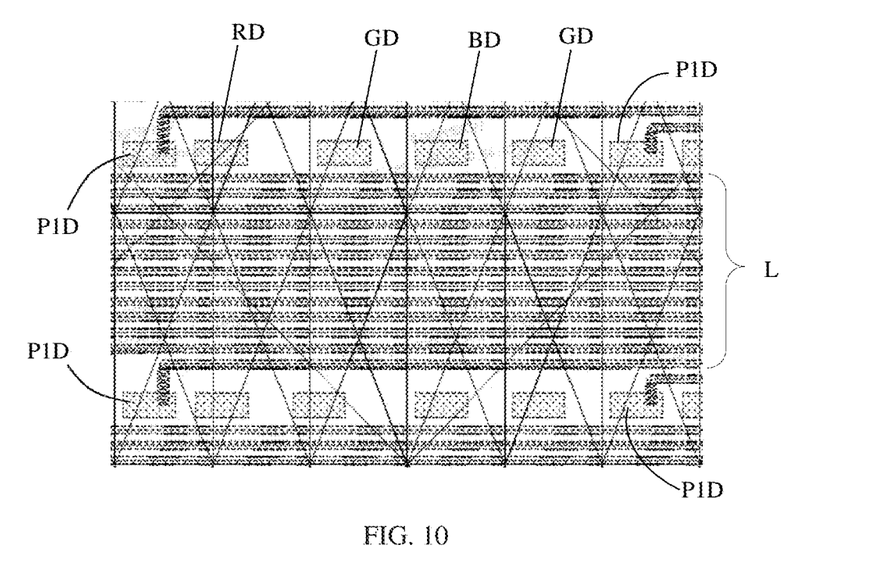
FIG. 10 is a schematic diagram of an arrangement of wires in a second display region of a display substrate provided by at least one embodiment of the present disclosure.

For example, FIG. 10 illustrates a schematic diagram of an arrangement of wires. As illustrated in FIG. 10, in some embodiments, in the direction perpendicular to the base substrate 110, each of at least part of the second sub-pixels P2 overlaps with 12-14 (for example, 13) wires L, and the 12-14 wires L are 12-14 first wires L1, that is, all of the 12-14 wires L are the first wires L1, or a part of the 12-14 wires L is the first wire L1, and the other part of the 12-14 wires L is the second wire L2. For example, in the case of the above-mentioned arrangement, both the line width of the wire L and the distance between two adjacent wires L can be greater than 1.8 microns, which fully meets the arrangement requirements of the wires.

For example, FIG. 10 illustrates connecting vias P1D of two adjacent rows of first pixel driving circuits in the second display region. As illustrated in FIG. 10, 12-14 (for example, 13) wires L are provided between the connecting vias P1D of the two adjacent rows of first pixel driving circuits, and the 12-14 wires L are 12-14 first wires L1, that is, all of the 12-14 wires L are the first wires L1, or a part of the 12-14 wires L is the first wire L1, and the other part of the 12-14 wires L is the second wire L2. For example, in the same row, three or four (the case shown in the figure) connecting vias for connecting the second pixel driving circuits of second sub-pixels to wires are provided between connecting vias P1D of two adjacent first pixel driving circuits. The three or four connecting vias of the second pixel driving circuits of second sub-pixels are used for a plurality of second sub-pixels in one second pixel unit, for example, the figure illustrates one via RD for one second red sub-pixel, two vias GD for two second green sub-pixels, and one via BD for one second blue sub-pixel.

For example, in some embodiments, the first wire L1 is at least partially light-transmissive, so as to ensure the light-transmissive requirements of the first display region 10; the second wire L2 is at least partially light-transmissive, so as to achieve substantially the same light-transmissive effect and signal transmission effect as the first wire L1, or in some embodiments, the second wire L2 may also be opaque. For example, in some embodiments, the material of the first wire L1 includes transparent metal oxide, such as indium tin oxide (ITO), etc. In the case where the second wire L2 is at least partially light-transmissive, the material of the second wire L2 may be the same as the material of the first wire L1; and in the case where the second wire L2 is opaque, the material of the second wire L2 may be metal materials such as copper, aluminum, molybdenum, or titanium, or alloy materials.

For example, in some embodiments, as illustrated in FIG. 4 and FIG. 6, in the first display region 10, the plurality of first sub-pixels P1 are arranged in a plurality of rows and columns; in the second display region 20, the plurality of first pixel driving circuits D1 are arranged in a plurality of rows and columns; and the light-emitting device E1 of the first sub-pixel P1 and the first pixel driving circuit D1, which are electrically connected to each other by the first wire L1, are in the same row.

Therefore, in the above-mentioned arrangement of connecting a light-emitting device and a pixel driving circuit by a transparent wire, the light-emitting device and the pixel driving circuit correspond to each other in rows, and there is no cross-row or cross-column connection, so the regularity of the arrangement of the transparent wires can be improved, thereby contributing to the circuit layout in the display substrate.

For example, in some embodiments, as illustrated in FIG. 4 and FIG. 6, the plurality of first wires L1 are regularly arranged without intersecting, so as to avoid signal crosstalk caused by crossing wires. For example, the arrangement of the first wires L1 may be designed according to the arrangement rule of the sub-pixels. For example, in the embodiments illustrated in FIG. 4 and FIG. 6, first light-emitting devices of the first red sub-pixels R1 and the first blue sub-pixels B1 are basically on the same straight line, so at least part of the first light-emitting devices of the first red sub-pixels R1 and the first blue sub-pixels B1 in the same row are connected to corresponding first pixel driving circuits by using the same set of wires, for example, the set of wires shown in the figure extend above the first light-emitting devices of the first red sub-pixels R1 and the first blue sub-pixels B1. For example, first light-emitting devices of the first green sub-pixels G1 in the same row are basically on the same straight line, so at least part of the first light-emitting devices of the first green sub-pixels G1 in the same row are connected to corresponding first pixel driving circuits by using the same set of wires, for example, the set of wires shown in the figure extend under the first light-emitting devices of the first green sub-pixels G1.

For example, in some other embodiments, the first light-emitting devices E1 of the plurality of first sub-pixels P1 in the same row and corresponding first pixel driving circuits D1 are respectively connected to each other in a "near to near, far to far" connection mode.

Figure 11:
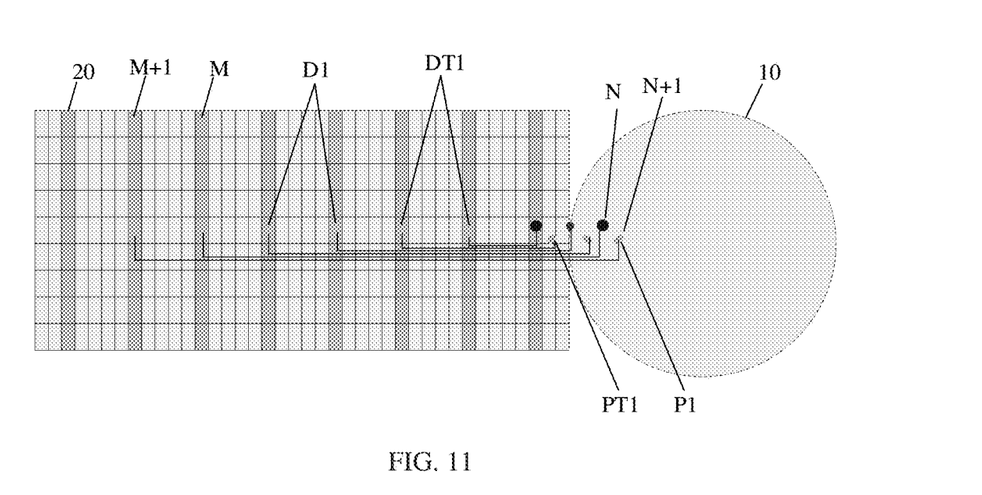
FIG. 11 is a schematic diagram of a connection of wires in a second display region of a display substrate provided by at least one embodiment of the present disclosure.

For example, as illustrated in FIG. 11, the plurality of first sub-pixels P1 include a first sub-pixel P1 in an (N)th column and a first sub-pixel P1 in an (N+1)th column, both of which are in the same row, and the first sub-pixel P1 in the (N+1)th column is on a side of the first sub-pixel P1 in the (N)th column away from the second display region 20 (illustrated as the right side in the figure); the plurality of first pixel driving circuits D1 include a first pixel driving circuit D1 in an (M)th column and a first pixel driving circuit D1 in an (M+1)th column, both of which are in the same row, and the first pixel driving circuit D1 in the (M+1)th column is on a side of the first pixel driving circuit D1 in the (M)th column away from the first display region 10 (illustrated as the left side in the figure); in this case, a first light-emitting device E1 of the first sub-pixel P1 in the (N)th column is electrically connected to the first pixel driving circuit D1 in the (M)th column, and a first light-emitting device E1 of the first sub-pixel P1 in the (N+1)th column is electrically connected to the first pixel driving circuit D1 in the (M+1)th column.

As a result, the first wires of the plurality of first sub-pixels P1 in the same row are regularly arranged without intersecting, so as to avoid crosstalk, short circuit and other undesirable phenomena between the wires. For example, in some embodiments, the first transition light-emitting devices of the first transition sub-pixels PT1 and the first light-emitting devices of the plurality of first sub-pixels P1 together adopt a "near to near, far to far" connection mode. In this case, the first transition pixel driving circuits DT1 of the first transition sub-pixels PT1 are on a side of the first pixel driving circuits D1 of the first sub-pixels P1 close to the first display region 10.

For example, in some embodiments, as illustrated in FIG. 4, the first light-emitting device E1 includes a first electrode 211 electrically connected to the first pixel driving circuit D1, and the second light-emitting device E2 includes a second electrode 311 electrically connected to the second pixel driving circuit D2. For example, the average size of first electrodes 211 of first light-emitting devices E1 of the plurality of first sub-pixels P1 is smaller than the average size of second electrodes 311 of second light-emitting devices E2 of the plurality of second sub-pixels P2. Therefore, the first light-emitting device E1 of the first sub-pixel P1 in the first display region 10 adopts a small anode design, thereby increasing the light transmittance of the first display region 10.

For example, the size of the first electrode 211 of the first light-emitting device E1 of the first red sub-pixel R1 is smaller than the size of the second electrode 311 of the second light-emitting device E2 of the second red sub-pixel R2; the size of the first electrode 211 of the first light-emitting device E1 of the first green sub-pixel G1 is smaller than the size of the second electrode 311 of the second light-emitting device E2 of the second green sub-pixel G2; and the first electrode 211 of the first light-emitting device E1 of the first blue sub-pixel B1 is smaller than the size of the second electrode 311 of the second light-emitting device E2 of the second blue sub-pixel B2. That is, the size of the first electrode 211 of the first light-emitting device E1 of each color sub-pixel in the first display region 10 is reduced to obtain a higher light transmittance.

For example, in some embodiments, as illustrated in FIG. 4, the first transition light-emitting device ET1 includes a first transition electrode 211 electrically connected to the first transition pixel driving circuit DT1, and the average size of first transition electrodes 211 of first transition light-emitting devices ET1 of the plurality of first transition sub-pixels PT1 is smaller than the average size of the second electrodes 311 of the second light-emitting devices E2 of the plurality of second sub-pixels P2, for example, greater than or equal to the average size of the first electrodes 211 of the first light-emitting devices E1 of the plurality of first sub-pixels P1.

For example, in some embodiments, the second transition light-emitting device ET2 includes a second transition electrode 311 electrically connected to the second transition pixel driving circuit DT2, and the average size of second transition electrodes of second transition light-emitting devices ET2 of the plurality of second transition sub-pixels PT2 is smaller than the average size of the second electrodes of the second light-emitting devices E2 of the plurality of second sub-pixels P2. For example, in some embodiments, the average size of the second transition electrodes of the second transition light-emitting devices ET2 of the plurality of second transition sub-pixels PT2 is equal to the average size of the first transition electrodes of the first transition light-emitting devices ET1 of the plurality of first transition sub-pixels PT1.

Therefore, the first sub-pixels P1 in the first display region 10 adopt a setting mode of "small anode, remote driving", the first transition sub-region 301 adopts a setting mode of "small anode, remote driving, dummy pixel driving circuit", the second transition sub-region 302 adopts a setting method of "small anode, in-situ driving", and the second sub-pixels in the second display region 20 adopt a setting mode of "large anode, in-situ driving". Because the light-emitting device with a large anode has a larger light-emitting area, the light-emitting brightness is greater. Through the above-mentioned settings, the display brightness difference between the first display region 10 and the second display region 20 can be weakened, the display brightness of the display substrate can be more uniform, and the display effect of the display substrate can be improved.

For example, in some embodiments, the first transition sub-region 301 includes two columns of first transition sub-pixels PT1 adjacent to the first display region 10. For example, in some embodiments, the second transition sub-region 301 includes at least two columns of second transition sub-pixels PT2 adjacent to the first transition sub-region 301. Therefore, the display transition between the first display region 10 and the second display region 20 is fully achieved.

For example, in some embodiments, the at least two columns of second transition sub-pixels PT2 include 2-8 columns of second transition sub-pixels PT2, and the 2-8 columns of second transition sub-pixels PT2 are all adopt the mode of in-situ driving, thus the number of wires can be reduced, and the arrangement of wires can be simplified.

For example, in some embodiments, as illustrated in FIG. 3 and FIG. 4, the first display region 10 as a whole is circular or elliptical, and the transition display region 30 as a whole is rectangular; or, in some embodiments, the transition display region 30 further includes corner regions in the upper left corner and lower left corner (and upper right corner and lower right corner) of the first display region 10, that is, the part illustrated by the ellipse in FIG. 4, in this case, the transition display region 30 as a whole is arc-shaped, that is, the arc-shaped region surrounding the first display region 10 can be set as the transition display region 30.

For example, in the arc-shaped transition display region 30, the first transition light-emitting device of the first transition sub-pixel close to the first display region 10 is driven by the first transition pixel driving circuit in the second display region 20, and the second transition sub-pixel close to the second display region 20 adopts the mode of in-situ driving. Thus, the arc-shaped transition display region 30 surrounding the first display region 10 can fully achieve a uniform display transition between the first display region 10 and the second display region 20.

For example, in some embodiments, as illustrated in FIG. 3, the display region includes two transition display regions 30, and the two transition display regions 30 are respectively on opposite sides of the first display region 10, and are symmetrical with respect to the first display region 10, that is, the two transition display regions 30 have basically the same structure, and the structures of the two transition display regions 30 are symmetrical with respect to the first display region 10.

For example, in some embodiments, as illustrated in FIG. 3, the display substrate further includes a third display region 40, and the third display region 40 at least partially surrounds the first display region 10 and the second display region 20. The third display region 40 includes a plurality of third sub-pixels P3.

Figure 12:
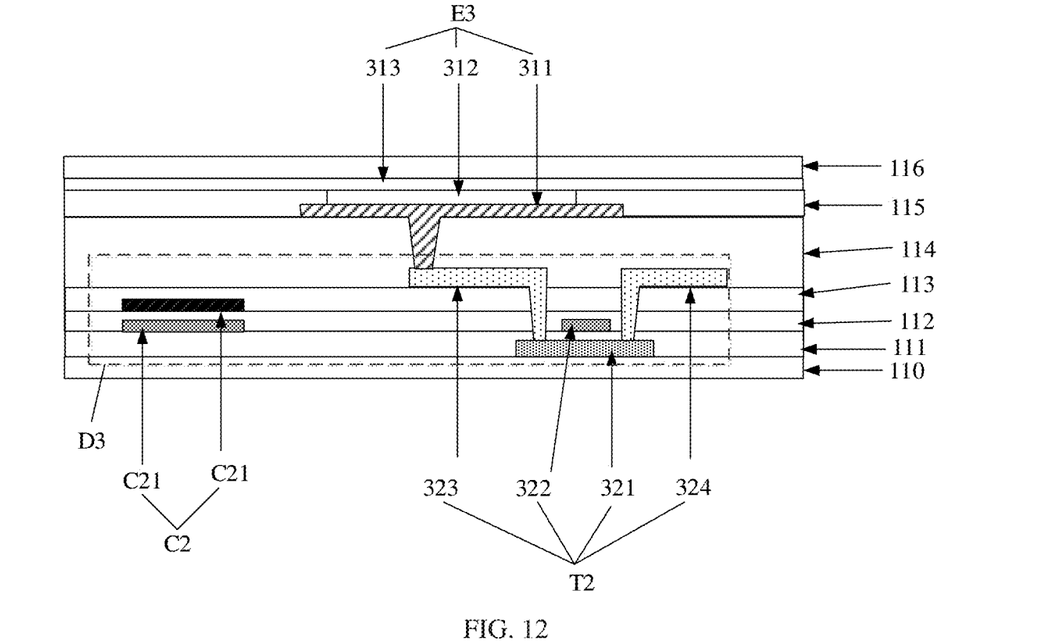
FIG. 12 is a schematic partially cross-sectional view of a third sub-pixel in a third display region of a display substrate provided by at least one embodiment of the present disclosure.

For example, FIG. 12 illustrates a schematic partially cross-sectional view of the third sub-pixel. As illustrated in FIG. 12, each of the plurality of third sub-pixels P3 includes a third light-emitting device E3 and a third pixel driving circuit D3 for driving the third light-emitting device E3, and in the direction perpendicular to the base substrate 110, the third light-emitting device E3 overlaps with the third pixel driving circuit D3. Therefore, each third sub-pixel P3 also adopts the mode of "in-situ driving". For example, the structure of the third pixel driving circuit D3 is basically the same as the structure of the second pixel driving circuit D2, for details, reference may be made to the related descriptions of the second pixel driving circuit D2, which will not be repeated here.

For example, in some embodiments, densities of the plurality of first light-emitting devices E1, the plurality of first transition light-emitting devices ET1, the plurality of second transition light-emitting devices ET2, the plurality of second light-emitting devices E2 and the plurality of third light-emitting devices E3 are the same. That is, the arrangement densities of the light-emitting devices for display in the first display region 10, the second display region 20, the transition display region 30 and the third display region 40 are the same, which is beneficial to improve the display uniformity of the display substrate.

Figure 13:
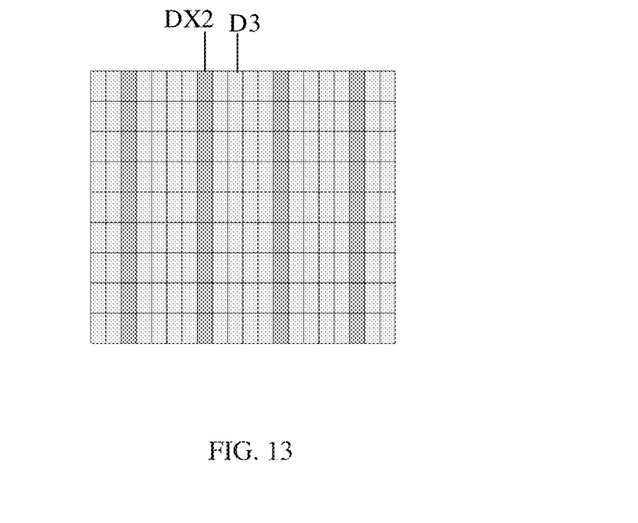
FIG. 13 is a schematic diagram of an arrangement of pixel driving circuits in a third display region of a display substrate provided by at least one embodiment of the present disclosure.

For example, FIG. 13 illustrates a schematic diagram of an arrangement of the pixel driving circuits in the third display region. In some embodiments, as illustrated in FIG. 13, the third display region 40 further includes a plurality of second dummy pixel driving circuits DX2. The plurality of second dummy pixel driving circuits DX2 are arranged in a plurality of columns, third pixel driving circuits D3 of the plurality of third sub-pixels P3 are arranged in a plurality of columns, and 3-4 columns of third pixel driving circuits D3 are provided between two adjacent columns of second dummy pixel driving circuits DX2. For example, the plurality of third sub-pixels P3 include a third red sub-pixel, a third green sub-pixel and a third blue sub-pixel, and the 3-4 columns of third pixel driving circuits D3 are respectively used to drive light-emitting devices of sub-pixels of different colors.

For example, the second dummy pixel driving circuit DX2 is not used to drive the light-emitting device. Providing the second dummy pixel driving circuit DX2 can improve the uniformity of the arrangement of the overall pixel driving circuits of the display substrate, and improve the etching uniformity in different display regions of the display substrate during the manufacturing process, thereby improving the display uniformity of the overall display substrate.

It should be noted that, in the embodiments of the present disclosure, the display substrate may be a flexible display substrate. In this case, the base substrate 110 may be a flexible substrate such as polyimide (PI); or, the display substrate may also be a rigid substrate, in this case, the base substrate 110 may be a rigid substrate such as glass or quartz.

For example, in some embodiments, the base substrate 110 may further be provided with functional layers such as a barrier layer and a buffer layer, which are not illustrated in the figure. The barrier layer and the buffer layer may be made of inorganic insulating materials such as silicon oxide, silicon nitride or silicon oxynitride. For example, the materials of the gate electrode, the first capacitor plate and the second capacitor plate may include metals such as aluminum, titanium, copper, cobalt, etc., or alloy materials, and may be formed as a single-layer metal structure or a multi-layer metal structure, such as titanium/aluminum/titanium, molybdenum/aluminum/molybdenum, titanium/copper/titanium or molybdenum/copper/molybdenum and other three-layer metal structure. The active layer may be made of materials such as polysilicon and metal oxide, etc., and the gate insulating layer and the interlayer insulating layer may be made of inorganic insulating materials such as silicon oxide, silicon nitride or silicon oxynitride.

For example, a pixel defining layer 115 is provided on the first electrode of the light-emitting device to define a plurality of sub-pixels; an encapsulation layer 116 is provided on the second electrode of the light-emitting device, and the encapsulation layer 116 may be, for example, a composite encapsulation layer, such as a stacked layer including an organic encapsulation layer and an inorganic encapsulation layer, in this case, the materials of the pixel defining layer 115 and the organic encapsulation layer may be organic insulating materials such as polyimide and epoxy resin, etc., and the inorganic encapsulation layer may be made of an inorganic insulating material such as silicon oxide, silicon nitride or silicon oxynitride, etc.

For example, the material of the first electrode as the anode may include metal oxides such as ITO, IZO, etc., or metals such as Ag, Al, Mo, etc., or alloys thereof, for example, may be formed into a single-layer structure or a multi-layer structure, such as a multi-layer structure adopting Ag/ITO/Ag. The material of the organic light-emitting layer in the light-emitting material layer may be selected as a light-emitting material that can emit light of a certain color (such as red light, blue light or green light, etc.) according to requirements. In addition, the light-emitting material layer may further include auxiliary light-emitting layers such as a hole transport layer, a hole injection layer, an electron transport layer and an electron injection layer. The material of the second electrode as the cathode may include metals such as Mg, Ca, Li or Al, or alloys thereof, or metal oxides such as IZO and ZTO, etc., or organic materials with conductive properties such as PEDOT/PSS (poly 3,4-ethylenedioxythiophene/polystyrene sulfonate), etc.

The embodiments of the present disclosure do not limit the material of each functional layer, and the material of each functional layer is not limited to the above-mentioned examples.

At least one embodiment of the present disclosure further provides a display device, which includes the display substrate provided by the embodiments of the present disclosure. For example, the display device may be any product or component with a display function, such as a mobile phone, a tablet computer, a television, a monitor, a notebook computer, a digital photo frame, a navigator, or the like, which is not limited in the embodiments of the present disclosure. The display device has a large-screen and full-screen design, and has a more uniform display effect, thereby improving user experience.

The following statements should be noted:

(1) The drawings involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, having a base substrate, and comprising:
   a first display region, comprising a plurality of first sub-pixels on the base substrate, wherein each of the plurality of first sub-pixels comprises a first light-emitting device, and the first display region is at least partially light-transmissive;
   a second display region, on at least one side of the first display region, comprising a plurality of first pixel driving circuits and a plurality of first transition pixel driving circuits on the base substrate; and
   a transition display region, between the first display region and the second display region, comprising a first transition sub-region and a second transition sub-region, wherein the second transition sub-region is on a side of the first transition sub-region away from the first display region;
   wherein the first transition sub-region comprises a plurality of first transition sub-pixels on the base substrate, each of the plurality of first transition sub-pixels comprises a first transition light-emitting device, the second transition sub-region comprises a plurality of second transition sub-pixels, and each of the plurality of second transition sub-pixels comprises a second transition light-emitting device and a second transition pixel driving circuit for driving the second transition light-emitting device to emit light; and
   the plurality of first pixel driving circuits are electrically connected to a plurality of first light-emitting devices of the plurality of first sub-pixels respectively through a plurality of first wires, and the plurality of first transition pixel driving circuits are electrically connected to a plurality of first transition light-emitting devices of the plurality of first transition sub-pixels respectively through a plurality of second wires.

2. The display substrate according to claim 1, wherein the first transition sub-region further comprises a plurality of first dummy pixel driving circuits, the plurality of first dummy pixel driving circuits are on the base substrate, and the plurality of first transition light-emitting devices of the plurality of first transition sub-pixels are respectively on a side of the plurality of first dummy pixel driving circuits away from the base substrate; and
   in a direction perpendicular to the base substrate, the plurality of first transition light-emitting devices of the plurality of first transition sub-pixels respectively at least partially overlap with the plurality of first dummy pixel driving circuits.

3. The display substrate according to claim 1, wherein in a direction perpendicular to the base substrate, the second transition light-emitting device at least partially overlaps with the second transition pixel driving circuit.

4. The display substrate according to claim 1, wherein the second display region further comprises a plurality of second sub-pixels, each of the plurality of second sub-pixels comprises a second light-emitting device and a second pixel driving circuit for driving the second light-emitting device to emit light; and
   the second pixel driving circuit is on the base substrate, the second light-emitting device is on a side of the second pixel driving circuit away from the base substrate, and in a direction perpendicular to the base substrate, the second light-emitting device at least partially overlaps with the second pixel driving circuit.

5. The display substrate according to claim 4, wherein the plurality of first pixel driving circuits are arranged in a plurality of columns, a plurality of second pixel driving circuits of the plurality of second sub-pixels are arranged in a plurality of columns, and
   3-4 columns of second pixel driving circuits are arranged between every two adjacent columns of first pixel driving circuits.

6. The display substrate according to claim 4, wherein in the direction perpendicular to the base substrate, each of at least part of the plurality of second sub-pixels overlaps with 12-14 wires,
   the 12-14 wires are 12-14 first wires, or
   a part of the 12-14 wires is the first wire, and another part of the 12-14 wires is the second wire.

7. The display substrate according to claim 1, wherein the first wire is at least partially light-transmissive, and the second wire is at least partially light-transmissive or opaque.

8. The display substrate according to claim 1, wherein in the first display region, the plurality of first sub-pixels are arranged in a plurality of rows and columns;
   in the second display region, the plurality of first pixel driving circuits are arranged in a plurality of rows and columns; and
   a light-emitting device of a first sub-pixel and a first pixel driving circuit, electrically connected to each other through a first wire, are in a same row.

9. The display substrate according to claim 8, wherein the plurality of first sub-pixels comprise a first sub-pixel in an (N)th column and a first sub-pixel in an (N+1)th column, both of which are in a same row, and the first sub-pixel in the (N+1)th column is on a side of the first sub-pixel in the (N)th column away from the second display region;

the plurality of first pixel driving circuits comprise a first pixel driving circuit in an (M)th column and a first pixel driving circuit in an (M+1)th column, both of which are in a same row, and the first pixel driving circuit in the (M+1)th column is on a side of the first pixel driving circuit in the (M)th column away from the first display region; and     a first light-emitting device of the first sub-pixel in the (N)th column is electrically connected to the first pixel driving circuit in the (M)th column, and a first light-emitting device of the first sub-pixel in the (N+1)th column is electrically connected to the first pixel driving circuit in the (M+1)th column.

10. The display substrate according to claim 4, wherein the first light-emitting device comprises a first electrode electrically connected to the first pixel driving circuit, the second light-emitting device comprises a second electrode electrically connected to the second pixel driving circuit, and     an average size of a plurality of first electrodes of a plurality of first light-emitting devices of the plurality of first sub-pixels is smaller than an average size of a plurality of second electrodes of a plurality of second light-emitting devices of the plurality of second sub-pixels.

11. The display substrate according to claim 10, wherein the first transition light-emitting device comprises a first transition electrode electrically connected to the first transition pixel driving circuit, and     an average size of a plurality of first transition electrodes of a plurality of first transition light-emitting devices of the plurality of first transition sub-pixels is smaller than the average size of the plurality of second electrodes of the plurality of second light-emitting devices of the plurality of second sub-pixels.

12. The display substrate according to claim 11, wherein the second transition light-emitting device comprises a second transition electrode electrically connected to the second transition pixel driving circuit, and     an average size of a plurality of second transition electrodes of a plurality of second transition light-emitting devices of the plurality of second transition sub-pixels is smaller than the average size of the plurality of second electrodes of the plurality of second light-emitting devices of the plurality of second sub-pixels.

13. The display substrate according to claim 12, wherein the average size of the plurality of second transition electrodes of the plurality of second transition light-emitting devices of the plurality of second transition sub-pixels is equal to the average size of the plurality of first transition electrodes of the plurality of first transition light-emitting devices of the plurality of first transition sub-pixels.

14. The display substrate according to claim 10, wherein the average size of the plurality of first transition electrodes of the plurality of first transition light-emitting devices of the plurality of first transition sub-pixels is greater than or equal to the average size of the plurality of first electrodes of the plurality of first light-emitting devices of the plurality of first sub-pixels.

15. The display substrate according to claim 1, wherein the first transition sub-region comprises two columns of first transition sub-pixels adjacent to the first display region.

16. The display substrate according to claim 15, wherein the second transition sub-region comprises at least two columns of second transition sub-pixels adjacent to the first transition sub-region.

17. The display substrate according to claim 16, wherein the at least two columns of second transition sub-pixels comprise 2-8 columns of second transition sub-pixels.

18. The display substrate according to claim 1, wherein the transition display region as a whole is rectangular or arc-shaped.

19. The display substrate according to claim 1, further comprising:

a third display region, at least partially surrounding the first display region and the second display region, wherein the third display region comprises a plurality of third sub-pixels, and each of the plurality of third sub-pixels comprises a third light-emitting device and a third pixel driving circuit for driving the third light-emitting device; and     in a direction perpendicular to the base substrate, the third light-emitting device overlaps with the third pixel driving circuit.

20. The display substrate according to claim 19, wherein the third display region further comprises a plurality of second dummy pixel driving circuits, and the plurality of second dummy pixel driving circuits are arranged in a plurality of columns;

a plurality of third pixel driving circuits of the plurality of third sub-pixels are arranged in a plurality of columns; and     3-4 columns of third pixel driving circuits are arranged between two adjacent columns of second dummy pixel driving circuits.

* * * * *